(12) United States Patent
Chabinyc et al.

(10) Patent No.: US 7,327,774 B2
(45) Date of Patent: Feb. 5, 2008

(54) SELF-FORMING MICROLENSES FOR VCSEL ARRAYS

(75) Inventors: Michael L. Chabinyc, Burlingame, CA (US); Patrick Y. Maeda, Mountain View, CA (US); Christopher L. Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 479 days.

(21) Appl. No.: 11/015,937

(22) Filed: Dec. 17, 2004

(65) Prior Publication Data

US 2006/0131124 A1 Jun. 22, 2006

(51) Int. Cl.
*H01S 3/08* (2006.01)
(52) U.S. Cl. ............... 372/101; 372/50.23; 372/50.124
(58) Field of Classification Search ............. 372/50.23, 372/101
See application file for complete search history.

(56) References Cited

U.S. PATENT DOCUMENTS

| 4,690,715 | A | 9/1987 | Allara et al. |
| 5,256,596 | A | 10/1993 | Ackley et al. |
| 6,180,239 | B1 | 1/2001 | Whitesides et al. |
| 2002/0027300 | A1 | 3/2002 | Hartmann et al. |
| 2003/0091084 | A1* | 5/2003 | Sun et al. ............ 372/50 |

OTHER PUBLICATIONS

Hans et al., Self-organization of organic liquids on patterned self-assembled monolayers of Alkanethiolates on Gold, 1999.*

"Formation of Self-Assembled Monolayers of Alkanethiolson FaAs Surface with in Situ Surface Activation by Ammonium Hydroxide", by Theo Baum et al., 1999 American Chemical Society, Published on Web Nov. 13, 1999, pp. 8577-8579.

"Self-Organization of Organic Liquids on Patterned Self-Assembled Monolayers of Alkanethiolates on Gold", by Hans A. Biebuyck et al., Dept. of Chemistry, Harvard Univ., Mar. 14, 1994, pp. 2790-2793.

"Ink-Jet Fabrication of Polymer Microlens for Optical I/O Chip Packaging", by Yuzo Ishi et al., Jpn. J. Appl. Phys. vol. 39 (2000), pp. 1490-1493, published Nov. 15, 1999.

* cited by examiner

*Primary Examiner*—Michael Dung Nguyen
(74) *Attorney, Agent, or Firm*—Bever, Hoffman & Harms, LLP; Patrick T. Bever

(57) ABSTRACT

A Vertical Cavity Surface Emitting Laser (VCSEL) assembly including a VCSEL structure having a light-emitting region located on its surface, a relatively wettable region of a surface modifier coating formed over the light emitting region, and a microlens formed on the relatively wettable region. A relatively non-wettable region of the surface modifier coating is formed around the light-emitting region (e.g., on the electrode surrounding the light-emitting region). The surface modifier coating is formed, for example, from one or more organothiols that change the surface energies of the light-emitting region and/or the electrode to facilitate self-assembly and self-registration of the microlens material. The microlens material is printed, microjetted, or dip coated onto the VCSEL structure such that the microlens material wets to the relatively wettable region, thereby forming a liquid bead that is reliably positioned over the light-emitting region. The liquid bead is then cured to form the microlens.

10 Claims, 5 Drawing Sheets

SELF-FORMING MICROLENSES FOR VCSEL ARRAYS

BACKGROUND OF THE INVENTION

1. Field of the Invention

The invention relates generally to electronic materials processing, and more particularly to a system and method for fabricating microlenses on Vertical Cavity Surface Emitting Lasers (VCSELs).

2. Related Art

Unlike edge-emitting lasers that emit laser light horizontally from the etched side edge of a semiconductor stack, VCSELs are characterized in that the emitted laser beam is emitted vertically from the substrate surface. VCSELs thus have significant advantages over edge-emitting lasers in the areas of lower manufacturing, packaging, alignment, and testing costs, as well as lower power dissipation.

FIG. 8 is a perspective view depicting a multiple beam laser scanner or ROS (raster output scanner) system 800 used, for example, in a high resolution, high speed printing apparatus. System 800 generally utilizes a two-dimensional VCSEL array 810 that transmits several light beams 815 through pre-polygon optical devices 820 to a rotating polygonal mirror 830, which scans the beams through scan optics 840 and a directing mirror 850 to a photo-receptor 860, which performs high speed printing/scanning functions in response to the modulated intensity of the individual beams according to known techniques.

FIG. 9 is an enlarged plan view showing a thirty-six beam VCSEL array 810A, which represents one type of VCSEL array utilized in systems such as those depicted in FIG. 8. Each VCSEL 812 of array 810A is formed by an active region (e.g., GaAs) surrounded by an electrode (e.g., gold). In each VCSEL, laser photons resonate between mirrors grown into the substrate structure, and then emit vertically from light-emitting regions of the wafer surface.

Referring again to FIG. 8, in order for system 800 to operate as intended, the beams generated by array 810 must have sufficient energy to adequately expose the photoreceptor 860 or recording medium. That is if the light beams are too low in energy or power, then they will be unable to generate an image with enough light intensity that can be detected, captured, or recorded by the photoreceptor or recording medium.

One approach to addressing this problem is to increase the intensity generated by each beam, and to increase the sensitivity of the photoreceptor, thereby providing a suitable amount of light exposure. However, the beam intensity of current VCSEL devices is limited, and driving the VCSELs harder with more current can adversely affect lifetime and single transverse mode emission characteristics.

Another approach to improving the throughput of the optical system without changing the spacing between VCSELs is to utilize microlenses to reduce the divergence angle of the individual VCSELs in the array. This approach allows more light to be captured by the optical system and transmitted to the photoreceptor.

Current approaches to integrate microlenses and VCSEL arrays for this type of purpose include the hybrid mechanical assembly of a VCSEL array and a separate microlens array, and forming microlenses on the VCSEL by deposition and reflow of material like photoresist as additional steps in the VCSEL array fabrication process. A problem with the first conventional approach is that aligning the separate microlens array with the VCSEL array is time consuming and tedious, and prone to alignment error that can greatly reduce the effectiveness of the lens array. A problem with the second conventional approach is that the additional is that the additional processing steps significantly increase fabrication costs.

What is needed is an efficient and reliable method for forming microlenses on VCSEL arrays that avoids the problems associated with the conventional approaches discussed above.

SUMMARY OF THE INVENTION

The present invention is directed to a VCSEL (or other light emitting or light receiving device) assembly and a method for producing VCSEL assemblies in which VCSEL (or other light emitting or receiving) structures are surface-treated in a way that causes an applied lens-forming material to form self-assembled and self-registered (self-aligned) microlens structures over the light-emitting region of each VCSEL. In particular, the surface treatment involves forming a surface modifier coating (e.g., reactive organic molecules or polymers) over the VCSEL light-emitting region such that a liquid lens-forming material that is deposited onto the surface can be confined to that region, thus forming a domed liquid bead over the light-emitting region. The domed liquid bead may then be cured to fix the position, shape, and structure of the self-assembling microlens. As in conventional systems, the presence of the microlens over the VCSEL reduces the divergence angle of the laser (light) beam generated from the VCSEL without increasing the size (area) of the light-generating region, thereby facilitating the formation of closely-spaced VCSEL arrays. The present invention thus provides advantages over conventional microlens forming methods by providing self-assembly and self-alignment (self-registration) of the microlenses, which avoids the cost and assembly difficulties associated with the integration of a VCSEL Array and a microlens array, as required by conventional microlens formation techniques.

In accordance with an exemplary embodiment, a microlens is formed on a VCSEL utilizing GaAs as the active material, and a gold electrode that is formed on an upper GaAs surface and defines a central aperture that surrounds a light-emitting region. Surface treatment involves forming a relatively wettable monolayer region over the light-emitting region, and forming a relatively non-wettable monolayer region on the electrode around the relatively wettable monolayer region. In one embodiment, both the relatively wettable and relatively non-wettable monolayer regions are formed using appropriate organothiols (e.g., an organothiol functionalized with a carboxylic acid to form the relatively wettable region, and an alkanethiol to form the relatively non-wettable region). Both of these monolayer regions may be formed by dip-coating, thus facilitating use of the present invention to perform low-cost "retrofitting" of microlens structures onto existing VCSEL arrays. In other embodiments only one region may be modified using a chemical modifier. After forming the monolayer regions, a lens-forming material (e.g., optical epoxy or polymer) is printed, microjetted, or dip coated onto the VCSEL surface. The lens-forming material is either applied as a liquid, or as a solid that is subsequently melted. The liquid material self-registers to the relatively wettable monolayer region (i.e., flows out of the relatively non-wettable region), thus forming a domed liquid bead over the light-emitting region. The liquid bead is then cured or otherwise solidified to form the desired microlens.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention is described below with particular reference to Vertical Cavity Surface Emitting Laser (VCSEL) devices, and in particular to low-cost VCSEL assemblies that include a microlens formed over each VCSEL device. While the present invention is described below with particular reference to VCSEL devices utilizing gallium-arsenide (GaAs) as an active material, and gold (Au) for electrodes, it should be appreciated that the present invention is applicable to VCSEL devices constructed using other active materials and electrode metals. In addition, positional terms such as "upper", "lower", and "over" are used herein for convenience to indicate relative positions of associated structures formed on the subject VCSEL assembly, and are not intended to be related to a fixed external reference. Further, the same techniques and methods described herein can be applied to other light emitting structures, such as single light emitting diodes (LEDs), one-dimensional linear LED arrays, and two-dimensional LED arrays, and light receiving structures, such as image sensors (light emitting structures and light receiving structures are herein collectively referred to as "light emitting/receiving structures").

Figure 1:
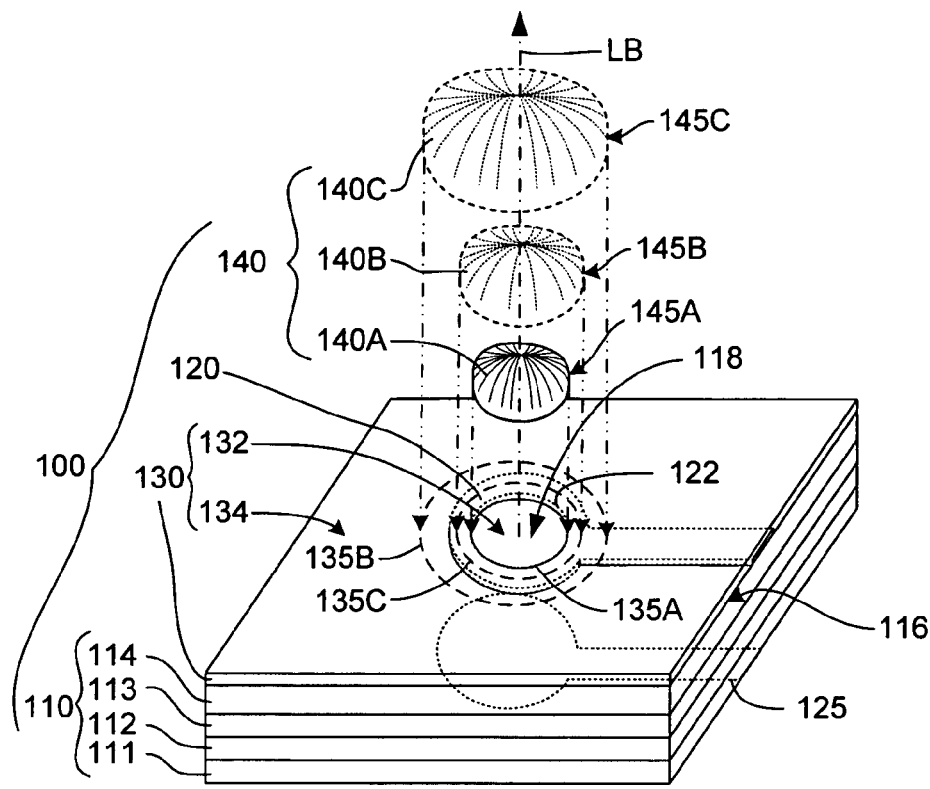
FIG. 1 is a perspective view showing a VCSEL assembly according to an embodiment of the present invention.

FIG. 1 is a simplified, partially exploded perspective view showing a VCSEL assembly 100 formed in accordance with an embodiment of the present invention. Referring to the left side of FIG. 1, VCSEL assembly 100 generally includes a VCSEL structure 110 including an upper electrode 120, a surface modifier coating 130 formed over upper electrode 120, and a microlens 140 formed on surface modifier coating 130.

VCSEL structure 110 generally includes a substrate 112 (e.g., n-doped GaAs), a first reflector stack 112 (e.g., alternating layers of n-doped GaAs and aluminum arsenide (AlAs)) formed over substrate 112, an active region 113 formed over first reflector stack 112, and a second reflector stack 114 (e.g., alternating layers of p-doped GaAs and AlAs) formed over active region 113. Upper electrode 120 is formed on an upper surface 116 of VCSEL structure 110, and a lower electrode 125 is formed on a lower surface of substrate 111. Typically, electrodes 120 and 125 include one of gold (Au) titanium, platinum and nickel. Upper electrode 120 defines a central aperture 122 the surrounds a light-emitting region 118 of upper surface 116. In general, during operation, a voltage potential applied across electrodes 120 and 125 generates laser photons at a frequency defined by the material and arrangement of VCSEL structure 110, which produces a laser beam LG that is emitted through light-emitting region 118 of upper surface 116. Note that additional structures associated with the operation of conventional VCSEL devices (e.g., cladding layers provided between active region 113 and the reflector stacks) are not required to describe the present invention, and are therefore omitted for brevity.

In accordance with an aspect of the present invention, surface modifier coating 130 is formed on upper surface 111 and/or upper electrode 120 to change the surface energy of the GaAs/metal in a manner that facilitates the self-assembly and self-registration of liquid lens-forming material, thereby facilitating the self-registration and self-assembly of microlens 140 over light-emitting region 118. In one embodiment, surface modifier coating 130 includes a relatively wettable region 132 that is located over light-emitting region 118, and a relatively non-wettable region 134 located around relatively wettable region 132. The terms "relatively wettable" and "relatively non-wettable" are utilized herein to describe surface energies that respectively cause a given liquid to spread or ball up. For example, wetting (or "relatively wettable") means that the contact angle between the liquid and the solid surface is small (e.g. <90°) that the liquid spreads over the solid surface easily, and nonwetting (or "relatively non-wettable") means that the angle is larger than that of the wettable region (e.g. >90°) so that the liquid has a tendency to preferentially coat the wettable region. In some embodiments, it may be preferable that the surface modifier coating on the light-emitting region 118 be non-wettable and the outlying region wettable. With respect to water, "relatively wettable" is synonymous with the term "hydrophilic", and "relatively non-wettable" is synonymous with "hydrophobic". As described below, with this arrangement a liquid-lens forming material applied onto surface modifier coating 130 forms a dome-shaped (domed) liquid bead on relatively wettable region 132 and flows away from relatively non-wettable region 134, which is then cured to form desired microlens 140. By positioning relatively wettable region 132 over light-emitting region 118, the present invention facilitates the self-registration (self-alignment) of microlens 140 over light-emitting region 118 due to the propensity for the applied lens-forming material to spontaneously generate a domed liquid bead on relatively wettable region 132. Further, by shaping relatively wettable region 132 in a circular shape and by selecting a suitable lens-forming material (i.e., a material that, in liquid form, generates a desired dome-shaped curvature), the present invention also facilitates self-assembly of microlens 140. This microlens is formed with good registration to the underlying light emitting region.

In accordance with another aspect of the present invention, relatively wettable region 132 and relatively non-wettable region 134 form a peripheral boundary, and microlens 140 has an outer peripheral edge that is substantially aligned with this peripheral boundary. As mentioned above, the liquid lens-forming material forms a domed liquid bead that is self-aligned with relatively wettable region 132. The term "substantially aligned" is used herein to account for slight displacement of the outer edge of microlens 140 relative to the peripheral wettable/non-wettable boundary that may occur during curing (i.e., expansion or contraction of the solidifying lens material). Referring to FIG. 1, in a presently preferred embodiment, a peripheral boundary 135A is defined by aperture 122 of upper electrode 120 (i.e., relatively wettable region 132 is located inside aperture 122, and relatively non-wettable region 134 is located outside of aperture 122—e.g., above upper electrode 120), and a microlens 140A has an outer edge 145A that is substantially aligned with peripheral boundary 135A. In another embodiment, which is indicated by dashed lines in FIG. 1, a peripheral wettable/non-wettable boundary 135B may be formed over upper electrode 120, and an associated microlens 140B having an outer edge 145B that is substantially aligned with peripheral boundary 135B. Alternatively, a peripheral wettable/non-wettable boundary 135C may be formed outside the outer edge of upper electrode 120, and an associated microlens 140C may be formed that includes an outer edge 145C substantially aligned with peripheral boundary 135C. Moreover, although the presently preferred assembly a includes surface modifier coating 130 having both relatively wettable region 132 and relatively non-wettable region 134, one of these regions may be omitted if the corresponding surface/electrode exhibit suitable surface energies. For example, if light-emitting region 118 has a surface energy exhibiting a suitable wettability to the selected lens-forming material, then wettable region 132 may be omitted (i.e., surface modifier coating 130 includes only relatively non-wettable region 134). Alternatively, if upper electrode 120 has a surface energy exhibiting a suitable non-wettability to the selected lens-forming material, then non-wettable region 134 may be omitted (i.e., surface modifier coating 130 includes only relatively wettable region 132).

In accordance with an embodiment of the present invention, surface modifier coating 130 is a self-assembled monolayer (SAM) consisting of at least one organothiol. Organothiols (RSH) form SAMs on GaAs, the active material of VCSEL structure 110, and also on Au, the metal typically used for upper electrode 120. SAMs can be applied selectively on Au and GaAs surfaces because the thin native oxide on GaAs is relatively unreactive towards organothiols. Because of this selectivity, the wettability of the surfaces of Au and GaAs can be changed selectively through the use of appropriate organothiols, e.g., an alkanethiol is relatively non-wettable (hydrophobic) and can thus be used to form relatively non-wettable region 134 of surface modifier coating 130, while many functionalized organothiols, e.g., an organothiol with a chemically polar headgroup such as carboxylic acid terminated-thiol, are relatively wettable (hydrophilic), and can thus be used to form relatively wettable region 132. SAMs formed of organothiols including sulfur, oxygen, and carbon may also be formed on Au and GaAs, with the presence of sulfur-based SAMs being relatively easy to detect. Other materials such as thiol-functionalized polymers can also be used as surface modifiers.

According to another aspect of the present invention, microlens 140 is formed using an optical pre-polymer or an optical polymer. The terms "optical pre-polymer" and "optical polymer" are used herein to indicate materials that are either a substantially transparent liquid at the wavelengths of interest or a solid material that forms a substantially transparent liquid upon melting, and in either case forms a substantially transparent solid microlens structure at the wavelengths of interest after a suitable curing process. Other suitable materials that exhibit the characteristics of optical pre-polymers and optical polymers may be used as well. In these cases the surface modifier forms a thin coating on the surface (<100 nm) that comprises more than one monolayer.

Figure 2:
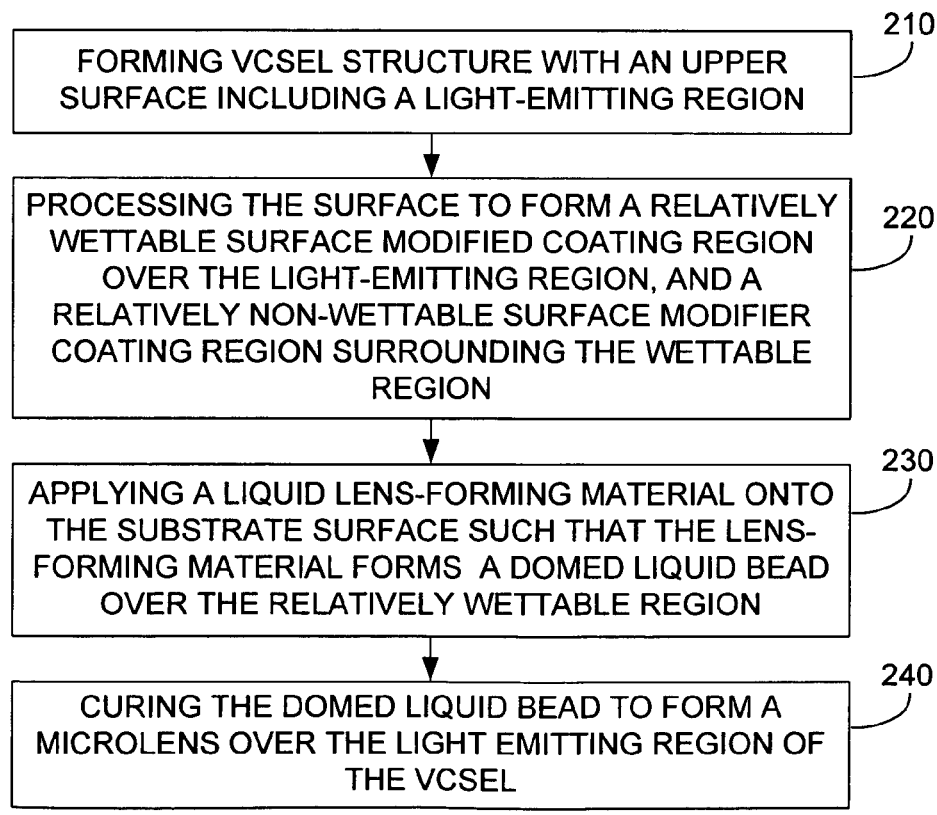
FIG. 2 is a flow diagram showing a simplified method for producing VCSEL assemblies according to another embodiment of the present invention.

FIG. 2 is a flow diagram showing a simplified production method for generating VCSEL assembly 100 according to another embodiment of the present invention. FIGS. 3 through 7 depict exemplary stages of the production method.

Referring to the upper portion of FIG. 2, the production method begins by fabricating a VCSEL structure using known techniques such that the VCSEL structure includes a light-emitting region located on an upper surface thereof (block 210). As discussed above, in one embodiment, an upper layer 114 of VCSEL structure 110 includes GaAs, such that an upper surface 116 of VCSEL structure 110 includes GaAs. In addition, upper electrode 120 is formed on upper surface 116 in the manner described above (i.e., such that an aperture 122 surrounds a light-emitting region 118 of VCSEL structure 110.

Figure 3:
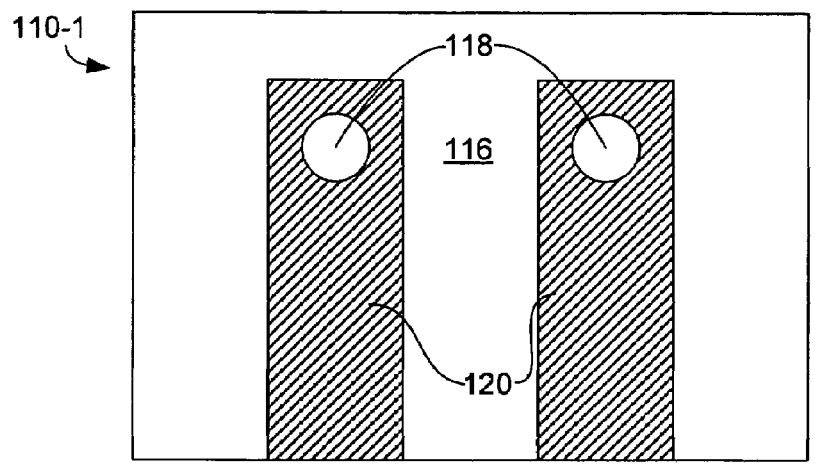
FIG. 3 is a top view showing a VCSEL array prior to the formation of a surface modifier coating and microlens.
Figure 4A:
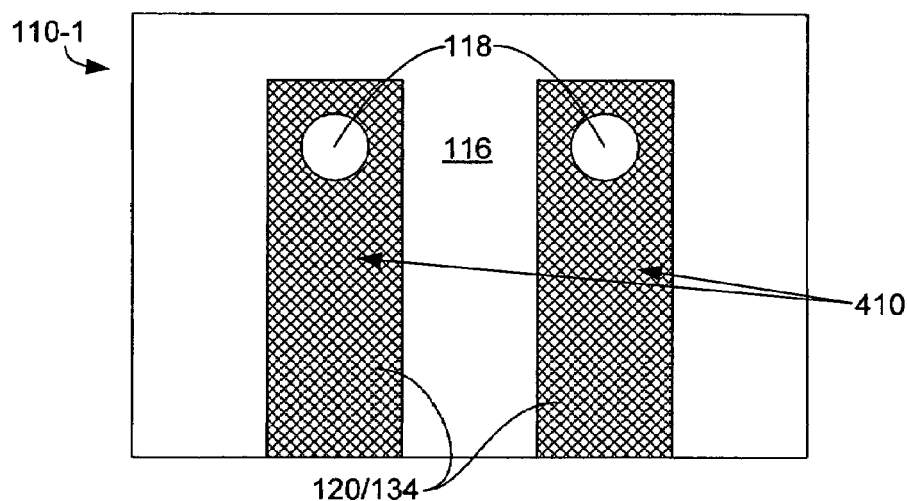
FIGS. 4(A) and 4(B) are cross-sectional views showing the VCSEL array of FIG. 5 during the formation of a surface modifier coating.
Figure 4B:
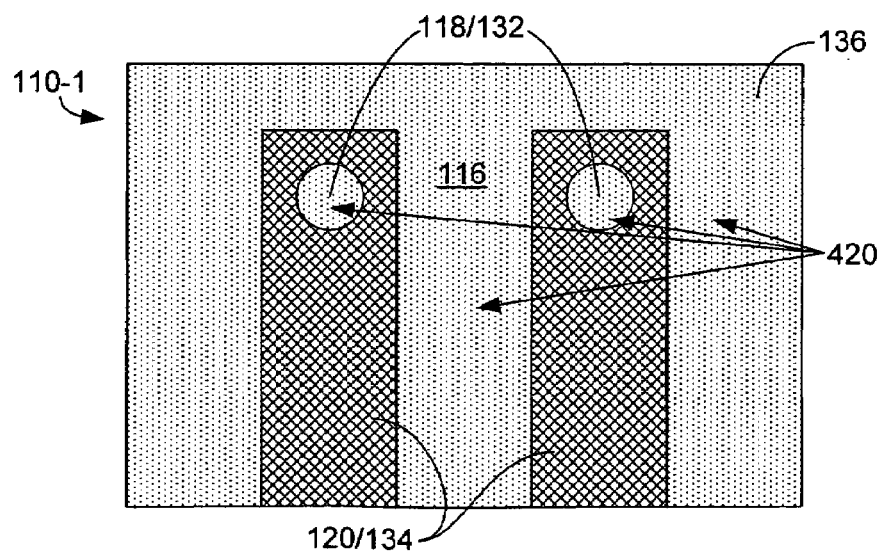

FIG. 3 is a top view showing a simplified VCSEL array 110-1 that includes two VCSELs, and is utilized to illustrate exemplary embodiments of the present invention. Each VCSEL device includes an electrode 120 and a light-emitting region 118 formed on an upper surface 116. VCSEL array 110-1 may include any number of VCSEL structures.

According to the present invention, the upper surface of the VCSEL structure is processed to form a surface modifier coating that includes at least one of relatively wettable region located over the light-emitting region, and relatively non-wettable region surrounding the light-emitting region (FIG. 2, block 220). As indicated in FIGS. 3(A) and 3(B), in one embodiment the surface modifier coating is formed in a two phase process that involves exposing VCSEL array 110-1 to a first thiol 410 (e.g., R—SH) to form relatively non-wettable SAM (region) 134 of the surface modifier coating on electrodes 120 (FIG. 3(A)), and then exposing VCSEL array 110-1 to a second thiol 420 (e.g., R'—SH in dilute $NH_4OH$) to form relatively wettable SAM (region) 132 of the surface modifier coating over light-emitting region 118 (FIG. 3(B)). Note that, in the present context, the "upper surface" is intended to include both upper surface 116 and the exposed surface of electrode 120. Note also that exposed portions of upper surface 116 located outside of the region defined by upper electrodes 120 may form relatively wettable SAMs without a debilitating effect. In this manner, the upper surface of VCSEL array 110-1 is treated in a way that produces areas of different wettabilities than enable self-assembly and self-alignment of the microlens structure.

Figure 5:
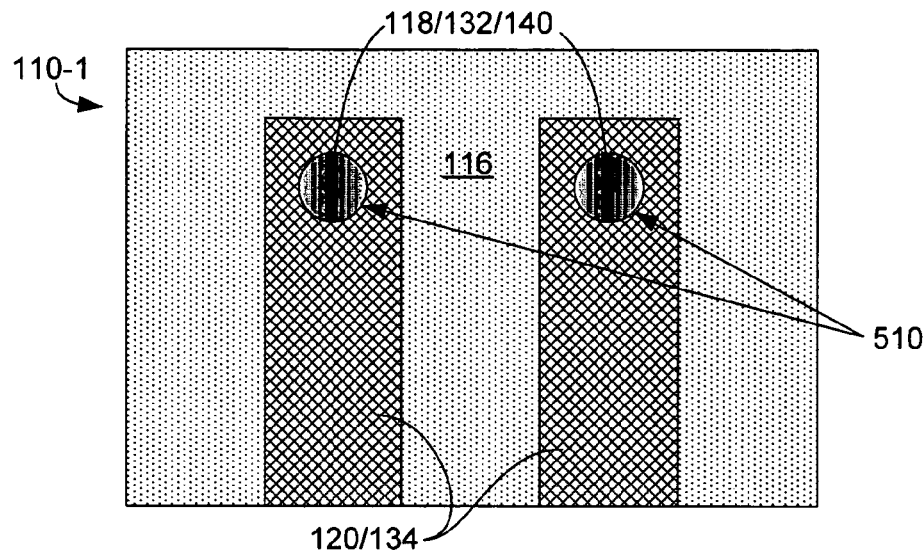
FIG. 5 is a top view showing the VCSEL array of FIG. 3 after formation of a surface modifier coating and microlens.

Next, lens-forming material is deposited over the surface of the VCSEL structure such that the lens-forming material forms a domed liquid bead over the relatively wettable region (FIG. 2, block 230), and the domed liquid bead is cured (if necessary) to form the completed microlens (FIG. 2, block 240). As indicated in FIG. 5, after upper surface 116 of VCSEL array 110-1 has been appropriately treated to provide relatively wettable regions 132 over light-emitting regions 118 and relatively non-wettable regions 134 over electrodes 120, a lens-forming material (e.g., a photo or thermally cured optical epoxy or polymer, such as Norland optical adhesive) 510 is then deposited using micro-jetting, printing, dip-coating, or another suitable method and optionally cured to form microlenses 140.

Figure 6A:
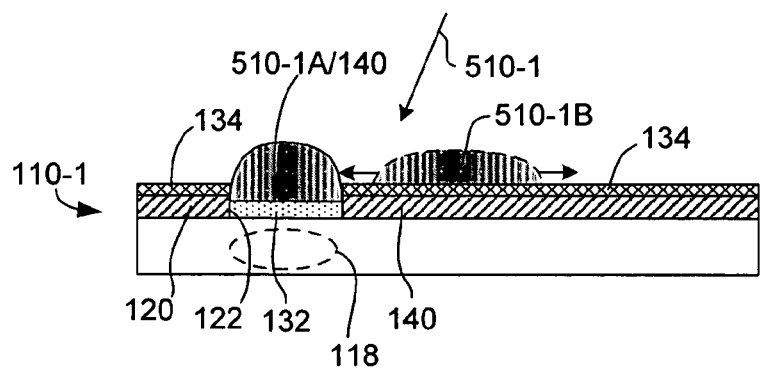
FIGS. 6(A) and 6(B) are cross-sectional views showing the application of lens-forming material onto the VCSEL array of FIG. 3 according to alternative embodiments of the invention.

FIG. 6(A) is a side view showing a first example in which a liquid lens-forming material 510-1 is applied (deposited) onto VCSEL array 110-1 by micro-jetting (i.e., ejecting from a print head similar to those used in ink-jet printers). The spreading of the uncured lens-forming material is controlled by the wettability of the SAMs provided in relatively wetting region 132 and relatively non-wetting region 134. That is, due to the wetting characteristic of the SAM provided in relatively wettable region 132, the liquid lens-forming material 510 entering aperture 122 forms a self-aligned domed liquid bead 510-1A that can be subsequently cured (if necessary) to form microlens 140. In contrast, the control provided by the wetting/non-wetting surfaces helps correct for mis-registration of printed drops. For example, a mis-registered uncured drop 510-1B will flow out of the region located over electrode 120 due to surface tension. Thus, the applied liquid microlens material 510 becomes self-aligned over light-emitting region 118, and forms a domed bead structure on the relatively wettable region.

Figure 6B:
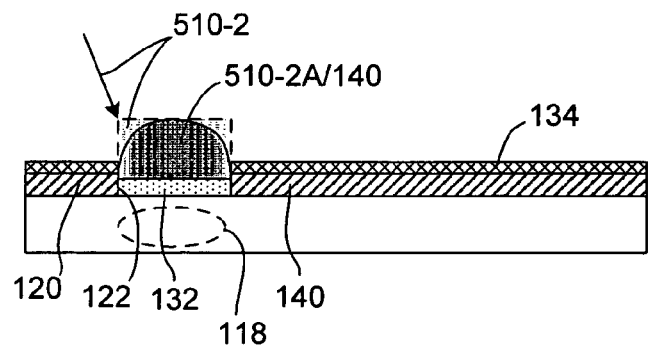

FIG. 6(B) depicts a second method for forming microlenses in which a solid lens-forming material 510-2 is printed in a solid form over aperture 122, and then melted to form a domed liquid bead 510-2A, which is in turn cured or otherwise allowed to solidify to form microlens 140. Note again that, when melted, the liquefied lens-forming material self-registers to relatively wettable region 132 (i.e., flows away from relatively non-wettable region 134), and self-assembles in that it forms domed liquid bead 510-2A.

Figure 7A:
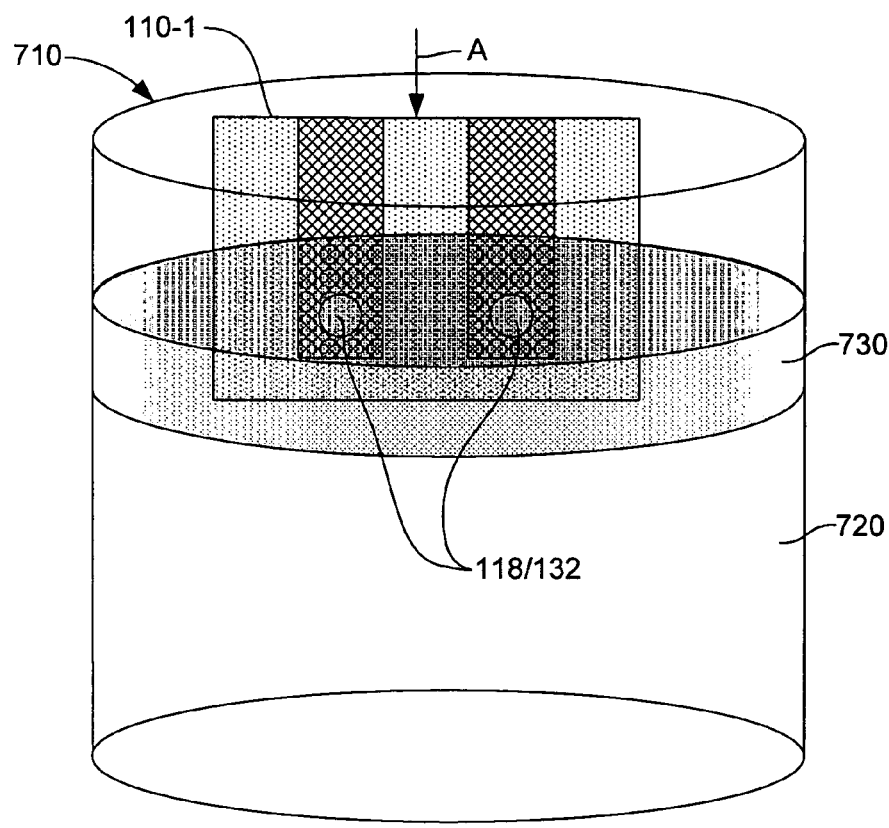
FIGS. 7(A) and 7(B) are perspective views showing the application of lens-forming material onto the VCSEL array of FIG. 3 according to another alternative embodiment of the invention.
Figure 7B:
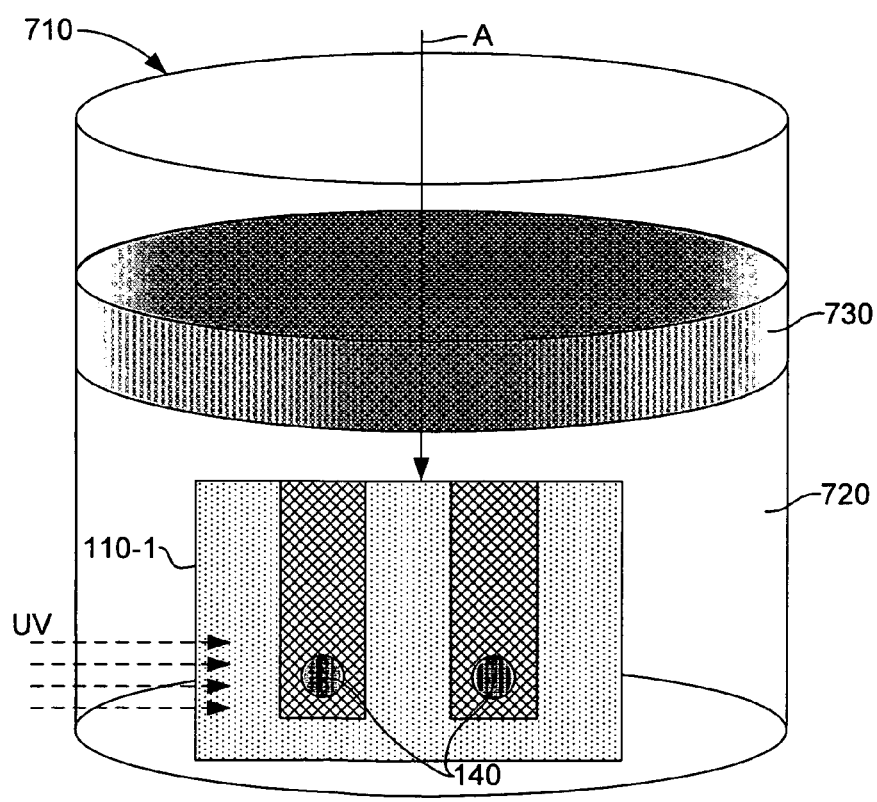
Figure 8:
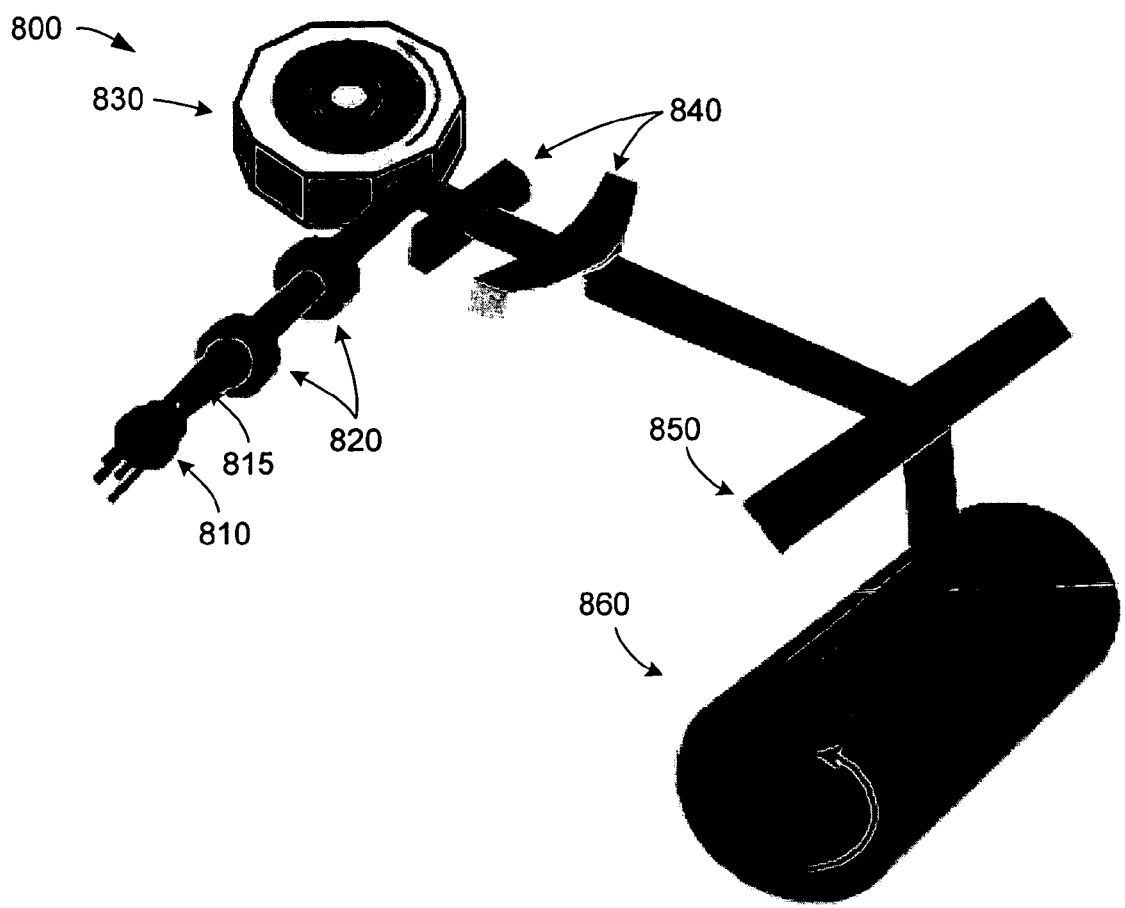
FIG. 8 is a simplified perspective view showing a conventional multiple beam laser scanner system.
Figure 9:
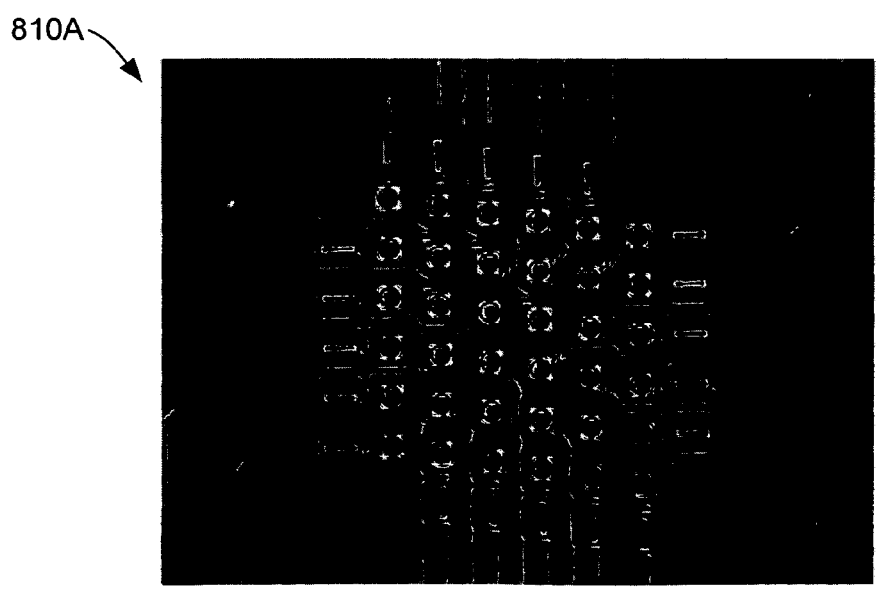
FIG. 9 is an enlarged plan view showing a conventional thirty-six beam VCSEL array.

FIGS. 7(A) and 7(B) are perspective views showing yet another method for depositing lens-forming material on VCSEL array 110-1 using dip-coating. Referring to FIG. 7(A), a vat or tank 710 includes a first liquid (e.g., water) 720 with a liquid lens-forming material layer (e.g., polymer) 730 floating thereon. In one embodiment, when VCSEL array 110-1 is inserted into tank 710 in the direction indicated by arrow A and passed through liquid lens-forming material layer 730. As shown in FIG. 7(B), VCSEL array 110-1 then passes from liquid lens-forming material layer 730 into first liquid 720. During this process, drops of liquid lens-forming material adhere to the region 132 formed over light-emitting regions 118 that has been treated with a surface modifier that is poorly wetted by liquid one. While immersed in liquid one, ultraviolet rays UV are applied to cure the drops of liquid lens-forming material, thereby forming microlenses 140.

The VCSEL production method described herein is capable of producing single VCSELs, one-dimensional linear VCSEL arrays (e.g., VCSEL array 110-1) and two-dimensional arrays of VCSELs with microlenses. Further, the proposed process is separable from the VCSEL manufacturing process, which enables the "retrofitting" fabrication of microlenses on completed VCSEL wafers or pre-fabricated VCSEL devices. That is, because the production method of the present invention does not require traditional micro-processing, minimal process integration with existing VCSEL fabrication processes is necessary. Microlenses can be easily retrofitted onto pre-fabricated VCSELs obtained from various producers. For example, microlenses can be fabricated by simply dipping completed VCSEL wafers into solutions of chemicals. The process is also very fast, with the formation of the SAMs taking seconds, and the formation of the microlens taking mere minutes (e.g., for UV-cure epoxies). This self-assembly and self-registration technique is a rugged, low cost process similar to how immersion gold is applied to pads on cheap circuit boards. The present invention thus provides the advantage of self-assembly and self-alignment of the microlenses and avoids the cost and assembly difficulties associated with the integration of a VCSEL Array and a microlens array. VCSEL/Microlens arrays produced in the proposed manner are thus more robust, and less expensive to produce.

The microlenses produced in accordance with the present invention reduce the divergence angle of each VCSEL while leaving the distance between VCSELs in the array unchanged. This keeps the magnification of the optical system and therefore the input acceptance angle of the optical system unchanged. Therefore, more light from the VCSEL array is captured by, for example, the ROS optics and transmitted to the photoreceptor in high-resolution laser scanner/printer systems. Much of the accuracy required for the microlens formation and positioning is already provided by the VCSEL structure, which is lithographically defined. Laser scanners will have their throughput increased and not be subject to the types of variations associated with misalignment of the microlenses relative to the VCSEL emitters that occur during operation due to thermal expansion in the supporting mechanical structure.

Although the present invention has been described in connection with several embodiments, it is understood that this invention is not limited to the embodiments disclosed, but is capable of various modifications that would be apparent to one of ordinary skill in the art. For example, the present invention may also be utilized in the production of backside-emitting VCSELs and intra-cavity VCSELs. In these devices, the "top" electrodes have no annular hole for light emission. Instead, light is emitted from a light emitting region of the substrate side, where a common cathode may or may not be situated. Similar to top-emitting VCSELs (such as those described above), the substrate surface on which the microlens would be made is typically GaAs. In embodiments where there is a common cathode, the cathode would have openings for light to come out, so the microlens fabrication process would be nearly identical to that described in detail above for the top-emitting case. In intra-cavity VCSELs where both electrodes are situated on the top surface, the backside would normally have no metal. In the later embodiments, an additional step to pattern a backside metal would be needed prior to microlens formation. Moreover, in addition to being used in the production of VCSELs, the present invention may also be utilized to produce other light sources, such as LEDs, and light receiving structures, such as image sensor arrays. Therefore, the invention is limited only by the following claims.

The invention claimed is:

1. A Vertical Cavity Surface Emitting Laser (VCSEL) assembly comprising:

a VCSEL structure including an upper layer defining a surface and a metal electrode disposed directly on the surface and defining a central aperture exposing a light emitting region of the surface;

a surface modifier coating disposed directly on the surface and on the metal electrode, the surface modifier coating comprising a first material that is disposed only on the light emitting region of the surface and that produces a relatively wettable region over the light emitting region, and second material that is disposed only on the metal electrode and that produces a relatively non-wettable region over the metal electrode; and a microlens formed on the relatively wettable region of the surface modifier coating.

2. The VCSEL assembly according to claim 1, wherein the relatively wettable region and the relatively non-wettable region define a peripheral boundary, and wherein the microlens includes an outer edge substantially aligned with the peripheral boundary.

3. The VCSEL assembly according to claim 1,
wherein the upper layer comprises Gallium-Arsenide (GaAs);
wherein the metal electrode comprises Gold (Au); and
wherein the surface modifier coating comprises a self-assembling monolayer (SAM) consisting of at least one organothiol.

4. The VCSEL assembly according to claim 3, wherein the microlens comprises one of an optical pre-polymer and an optical polymer.

5. The VCSEL assembly according to claim 1, wherein the surface modifier coating comprises a self-assembling monolayer (SAM) consisting of at least one organothiol.

6. A Vertical Cavity Surface Emitting Laser (VCSEL) assembly comprising:
a VCSEL structure including an upper layer defining a surface and a metal electrode disposed directly on the surface and defining a central aperture exposing a light emitting region of the surface;
a surface modifier coating formed on the surface, the surface modifier coating including a relatively wettable region located over the light emitting region; and
a microlens formed on the relatively wettable region of the surface modifier coating,
wherein the upper layer of the VCSEL structure comprises GaAs,
wherein the relatively wettable region comprises organothiol with a chemically polar headgroup,
wherein the electrode comprises gold,
wherein the relatively non-wettable region comprises alkanethiol, and
wherein the microlens comprises one of an optical pre-polymer and an optical polymer.

7. An array including a plurality of assemblies, each assembly comprising:
a light emitting/receiving structure including an upper layer defining a surface and a metal electrode disposed directly on the surface and defining a central aperture exposing a light emitting/receiving region of the surface;
a surface modifier coating formed on the surface, the surface modifier coating including a relatively wettable region located over the light emitting/receiving region; and
a surface modifier coating disposed directly on the surface and on the metal electrode, the surface modifier coating comprising a first material that is disposed only on the light emitting/receiving region of the surface and that produces a relatively wettable region over the light emitting/receiving region, and second material that is disposed only on the metal electrode and that produces a relatively non-wettable region over the metal electrode; and
a microlens formed on the relatively wettable region of the surface modifier coating.

8. The array according to claim 7, wherein the plurality of light emitting/receiving structures are arranged in a one-dimensional row.

9. The array according to claim 7, wherein the plurality of light emitting/receiving structures are arranged in a two-dimensional array.

10. The array according to claim 7, wherein the light emitting/receiving structure comprises one of a Vertical Cavity Surface Emitting Laser (VCSEL), a light emitting diode (LED), and a light sensor.

* * * * *